US006724337B1

United States Patent
Tan

(10) Patent No.: US 6,724,337 B1
(45) Date of Patent: Apr. 20, 2004

(54) METHOD AND DEVICE FOR ANALOG DIGITAL CONVERTING A SIGNAL INCLUDING A LOW-FREQUENCY COMPONENT

(75) Inventor: Kah Chye Tan, Technopreneur Centre (SG)

(73) Assignee: Addest Technovation Pte Ltd (SG)

( * ) Notice: Subject to any disclaimer, the term of this patent is extended or adjusted under 35 U.S.C. 154(b) by 0 days.

(21) Appl. No.: 10/089,649

(22) PCT Filed: Feb. 4, 2000

(86) PCT No.: PCT/SG00/00015
§ 371 (c)(1),
(2), (4) Date: Jul. 2, 2002

(87) PCT Pub. No.: WO01/58020
PCT Pub. Date: Aug. 9, 2001

(51) Int. Cl.$^7$ ................................................ H03M 1/12
(52) U.S. Cl. ......................... 341/155; 341/126; 341/156
(58) Field of Search ................................. 341/155, 156, 341/126, 157, 110, 118, 111; 375/223, 225, 295, 316

(56) References Cited

U.S. PATENT DOCUMENTS

| | | | |
|---|---|---|---|
| 5,577,066 A | * | 11/1996 | Schuchman et al. ......... 375/222 |
| 5,659,546 A | * | 8/1997 | Elder ........................... 370/343 |
| 5,715,235 A | * | 2/1998 | Sawahashi et al. .......... 370/206 |
| 6,041,076 A | * | 3/2000 | Franchville et al. ......... 375/224 |
| 6,061,385 A | * | 5/2000 | Ostman ....................... 375/130 |
| 6,337,885 B1 | * | 1/2002 | Hellberg ...................... 375/316 |

* cited by examiner

Primary Examiner—Brian Young
Assistant Examiner—John Nguyen
(74) Attorney, Agent, or Firm—Myers Dawes Andras & Sherman LLP; Joseph C. Andras

(57) ABSTRACT

A method is provided for analog/digital converting of at least one analog low-frequency signal with an analog/digital converter which can detect only an analog signal with a frequency above a predetermined border frequency value, wherein at least one analog low-frequency signal and at least one analog high-frequency signal are provided. An analog intermediate signal is generated from said analog low-frequency signal(s) and said analog high-frequency signal(s) and is input to the analog/digital converter. The analog intermediate signal is converted into a digital intermediate signal, and a digital low-frequency signal corresponding to said analog low-frequency signal is determined from the digital intermediate signal.

32 Claims, 6 Drawing Sheets

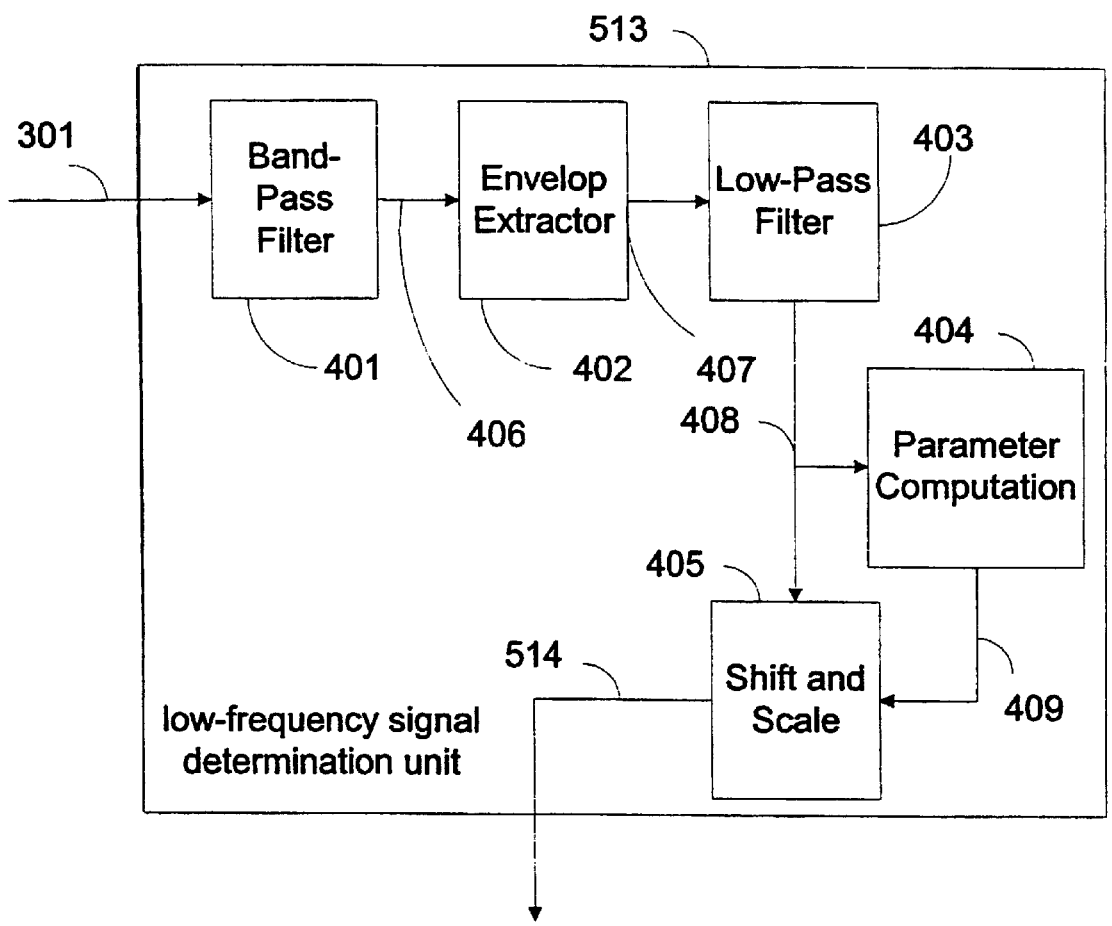

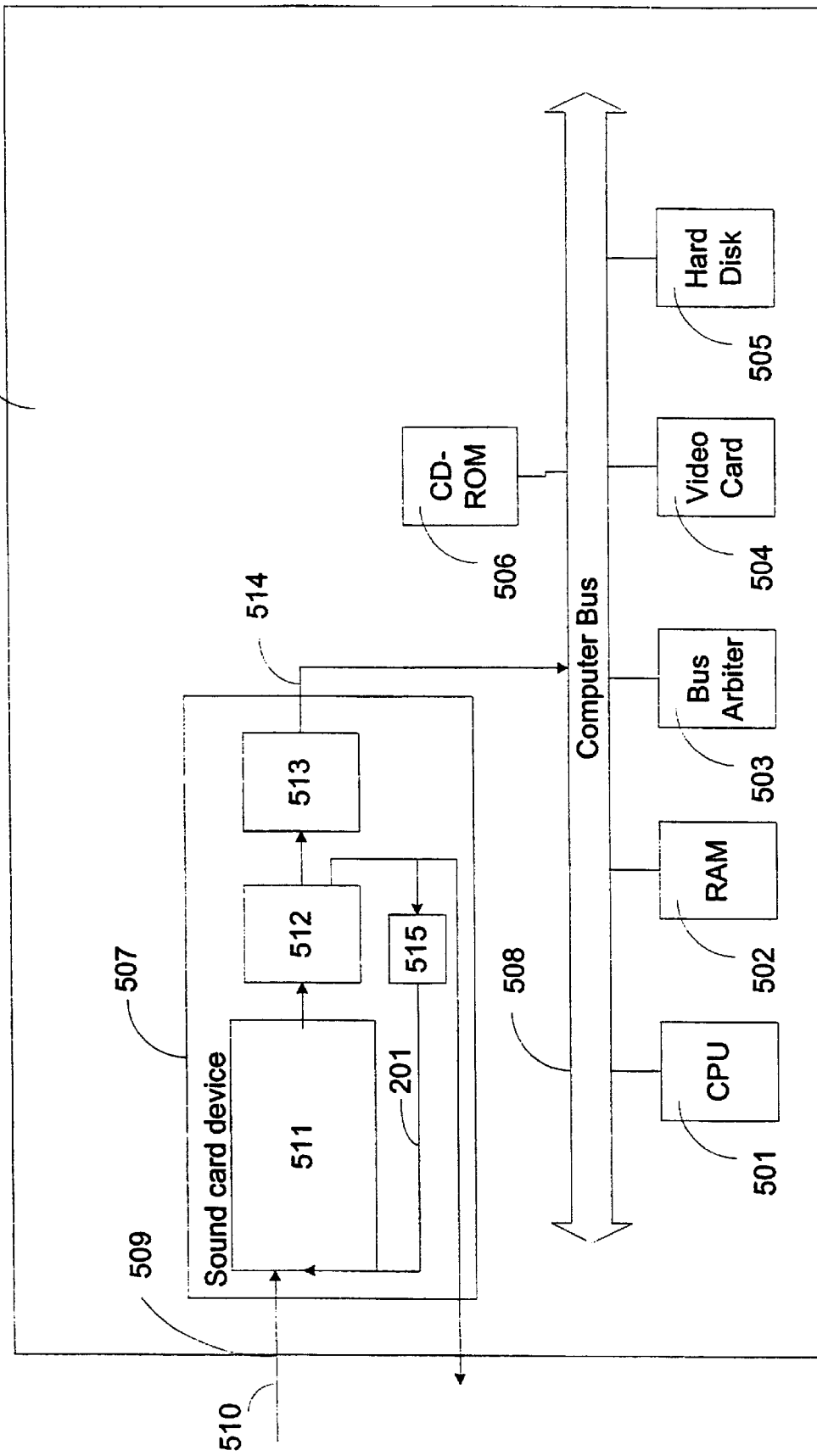

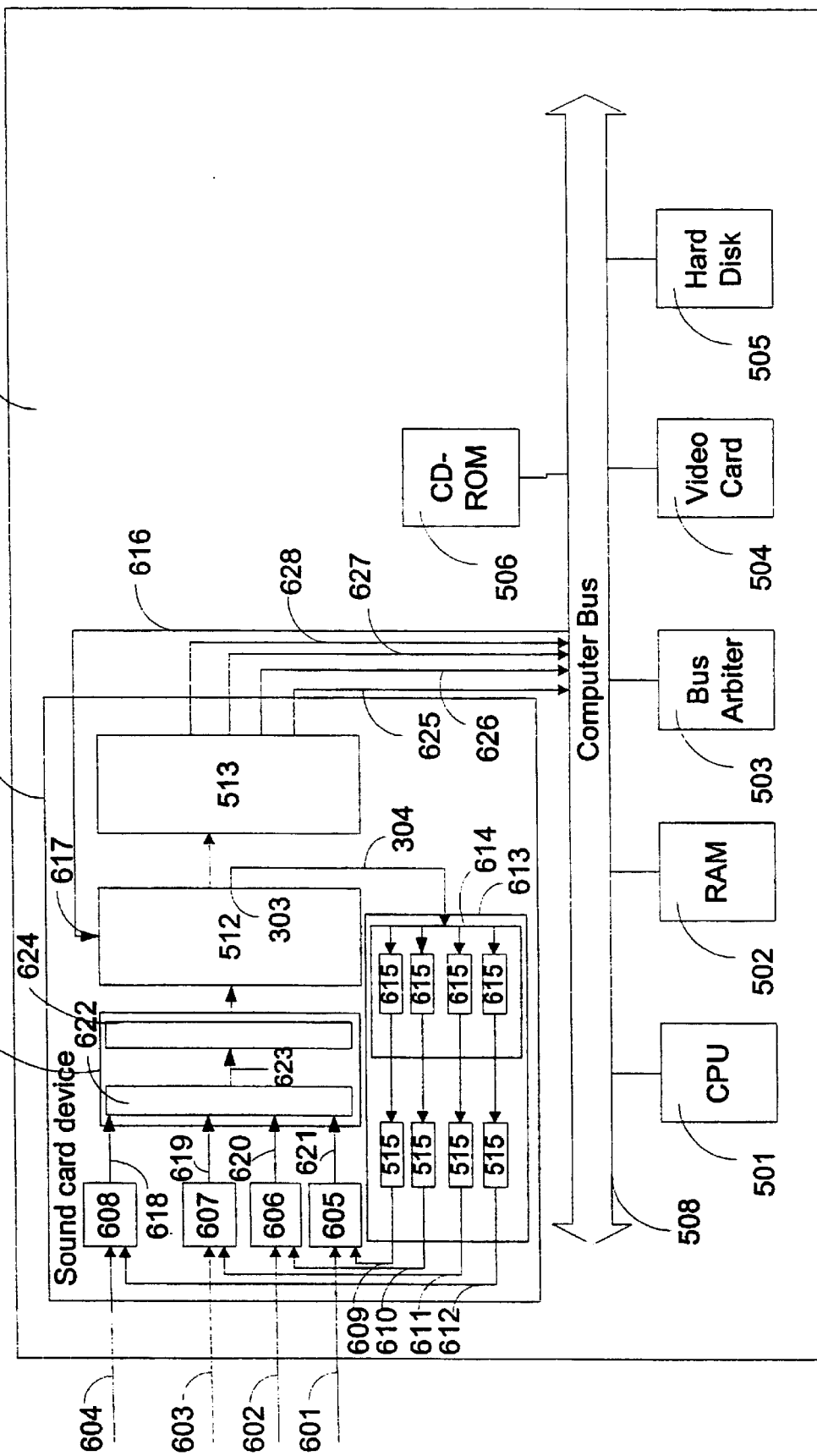

METHOD AND DEVICE FOR ANALOG DIGITAL CONVERTING A SIGNAL INCLUDING A LOW-FREQUENCY COMPONENT

BACKGROUND OF THE INVENTION

The invention relates to an analog/digital converter device for analog/digital converting of at least one analog low-frequency signal and to a method for analog/digital converting of at least one analog low-frequency signal.

A multimedia computer generally includes a sound card for converting a captured analog speech signal, which is input into the computer by a user via a microphone or a line-in-jack, into a digital signal, which digital signal may further be processed by a processing unit, e.g. a microprocessor. For converting the analog signal into a digital signal, an analog/digital converter in the sound card is provided.

However, many of the available sound cards attenuate substantially or even cut off components of the analog signal before the signal is applied to the analog/digital converter for being digitized. Usually, such a sound card has a predetermined border frequency value. The common sound card thus cannot usually detect and process an analog signal with a frequency below this predetermined border frequency value, e.g. it is not possible to capture and process an analog signal with direct-current (DC) signal components. An example of the border frequency value is a frequency of 20 Hz, i.e. many sound cards cannot capture and process an analog signal in a frequency range between 0 Hz and 20 Hz.

Though an audio analog signal usually has a frequency which is above that border frequency value of e.g. 20 Hz, a problem arises when the sound card is intended to be used as well for measurement of non-audio analog signals, as an analog low-frequency signal having frequency components below the predetermined border frequency value cannot be entirely captured by the sound card, since only an analog high-frequency signal which has frequency components only above the predetermined border frequency value and within the frequency range of the sound card can entirely be captured.

An "analog low-frequency signal" in this description means a signal with at least one important frequency component below the predetermined border frequency value of the sound card. "Important frequency component" in this context means that the capturing and processing of such a signal by the sound card, or more generally by an analog/digital converter, would result in an output signal from which the input analog low-frequency signal cannot be reconstructed. Accordingly, an analog low-frequency signal can be e.g. a DC signal or a signal with one or more important frequency components below the predetermined border frequency of the sound card.

Thus, it is not possible to use such a sound card for measurement of analog low-frequency signals.

U.S. Pat. No. 5,987,541 discloses a computer system with a sound card. In this system, the sound card includes a modulation interface for modulation/demodulation of a digitized speech signal on/from a carrier signal of a predetermined frequency. Thus, an analog speech signal is detected by the sound card, converted into a digitized speech signal and modulated on the carrier signal. This is to use different frequency channels on a computer bus for being used by different peripheral devices at the same time. However, with this computer system, if it is used in the scenario described above, measurement of an analog low-frequency signal is still impossible due to the border frequency of the sound card.

SUMMARY OF THE INVENTION

Thus, it is one object of the invention to provide a method for analog/digital converting of at least one analog low-frequency signal with an analog/digital converter which can capture only an analog signal with a frequency within a frequency range above a predetermined border frequency value.

This object is achieved with a method for analog/digital converting of at least one analog low-frequency signal with an analog/digital converter which can capture and convert only an analog signal with a frequency above a predetermined border frequency value, in which at least one analog low-frequency signal and at least one analog high-frequency signal are provided. The analog low-frequency signal is a signal with at least one important frequency component below the predetermined border frequency value according to the above definition, such as a non-audio low-frequency signal or even a direct-current signal, which is to be converted by the analog/digital converter. The analog high-frequency signal is an analog signal having only frequency components above the predetermined border frequency value and within the frequency range of the analog/digital converter. Using the analog low-frequency signal and the analog high-frequency signal, an analog intermediate signal is generated, the analog intermediate signal having a characteristic analog feature with which it is possible to reconstruct the analog low-frequency signal from the analog intermediate signal. In a further step, the analog intermediate signal is converted into a digital intermediate signal, i.e. the analog intermediate signal is digitized in the analog/digital converter. This digitizing is done e.g. by sampling the analog intermediate signal. The thus generated digital intermediate signal has a characteristic digital feature, which makes it possible to determine a digital low-frequency signal from the digital intermediate signal. This characteristic digital feature simply may be the digitized characteristic analog feature. In a last step, the desired digital low-frequency signal is determined from the digital intermediate signal using the characteristic digital feature.

It should be noted that the analog intermediate signal may also have frequency components below the predetermined border frequency value. However, it must have sufficient frequency components above the predetermined border frequency value so that it is possible to reconstruct the analog low-frequency signal from the digitized low-frequency signal after the analog intermediate signal has been captured and digitized by the analog/digital converter and the digital low-frequency signal is determined from the digital intermediate signal.

Therefore, according to the invention it is possible to process, i.e. also to capture and convert, at least one analog low-frequency signal with at least one important frequency component below the predetermined border frequency value of the analog/digital converter.

Furthermore, it is a further object of the invention to provide an analog/digital converter device for analog/digital converting of at least one analog low-frequency signal, the analog/digital converter device being able to process an analog low-frequency signal using an analog/digital converter which can detect only an analog signal with a frequency above a predetermined border frequency value, wherein the analog low-frequency signal has at least one important frequency component below the predetermined border frequency value.

This object is achieved with an analog/digital converter device comprising an analog intermediate signal generating unit. With this analog intermediate signal generating unit, the at least one analog low-frequency signal is mixed with a corresponding analog high-frequency signal.

In this context, when mixing the two signals, one may add the two signals, subtract the two signals, multiply the two signals, or convolve the two signals.

In general, in this context, the mixing may be any linear or non-linear operation, which is processed on the two signals, as far as this operation results in an analog intermediate signal which fulfills the above explained requirements.

The resulting analog intermediate signal generated by the analog intermediate signal generating unit is input to an analog/digital converter which has a predetermined border frequency value, below which the converter attenuates or cuts off frequencies of the input analog signal. That is, the input of the analog/digital converter is connected to the output of the analog intermediate signal generating unit.

By means of the analog/digital converter, the analog intermediate signal is digitized, i.e. for example sampled, thereby generating a digital intermediate signal. The digital intermediate signal has at least one characteristic digital feature, with which it is possible to determine a digital low-frequency signal from the digital intermediate signal.

The output digital intermediate signal is input to at least one low-frequency determination unit, an input of which is connected to an output of the analog/digital converter. With the low-frequency determination unit it is possible to determine the digital low-frequency signal from the digital intermediate signal using the characteristic digital feature.

Thus, the desired digital low-frequency signal is generated.

The low-frequency determination unit may be implemented as a separate hardware unit. Alternatively, the low-frequency determination unit may also be implemented by a software program, which may be executed by any processor e.g. of a computer system, e.g. by the central processing unit of a computer system, which is then the low-frequency determination unit. In other words, the determination of the digital low-frequency signal from the digital intermediate signal does not necessarily be performed in the sound card itself, but may be performed in a remote processor as well.

The characteristic analog feature may be for example the amplitude of the analog intermediate signal and/or its derivatives, when using amplitude modulation of the analog low-frequency signal and the analog high-frequency signal, the frequency of the analog intermediate signal and/or its derivatives, when using frequency modulation of the analog low-frequency signal and the analog high-frequency signal, the phase of the analog intermediate signal and/or its derivatives, when using phase modulation of the analog low-frequency signal and the analog high-frequency signal, the pulse of the analog intermediate signal and/or its derivatives, when using pulse modulation of the analog low-frequency signal and the analog high-frequency signal, or any combination of the characteristic analog features described above.

The characteristic digital feature may be the digitized characteristic analog feature, i.e. for example the amplitude of the digital intermediate signal and/or its derivatives, when using amplitude modulation, the frequency of the digital intermediate signal and/or its derivatives, when using frequency modulation, the phase of the digital intermediate signal and/or its derivatives, when using phase modulation, the pulse of the digital intermediate signal and/or its derivate, when using pulse modulation, or any combination of the characteristic digital features described above.

Thus, the characteristic feature, be it the characteristic analog feature or the characteristic digital feature, is enabling the demodulation, i.e. reconstruction of the low-frequency signal, either the analog or the digital low-frequency signal.

Furthermore, the invention provides for an analog intermediate signal generating unit for processing at least one analog low-frequency signal having an important frequency component below a predetermined border frequency value, the intermediate signal generating unit generating an analog intermediate signal such that the analog intermediate signal may be captured by an analog/digital converter, which is able to capture only an analog signal with a frequency within a frequency range above the predetermined border frequency value. The analog intermediate signal generating unit comprises a unit for generating the analog intermediate signal by using at least one analog high-frequency signal, which has a frequency above the predetermined border frequency value.

The analog/digital converter device or the analog intermediate signal generating unit according to the invention are preferably used in conjunction with a sound card. As described above, common sound cards usually have the disadvantage that they cannot be used to capture analog non-audio signals with frequencies below the predetermined border frequency value of the sound card. Thus, the advantage of using the analog/digital converter device or the analog intermediate signal generating unit according to the invention in conjunction with such a sound card becomes apparent. The analog/digital converter device according to the invention will be called in the following "sound card device", if used in conjunction with a sound card.

As the analog high-frequency signal, a sine wave signal having a frequency above the predetermined border frequency value may be used. Preferably, the sine wave signal has a frequency of about 5,000 Hz. It should be noted that many sound cards can capture analog signals in a frequency range from 20 Hz to 20,000 Hz. Thus, choosing a frequency of about 5,000 Hz as a frequency of the high-frequency sine wave signal leads to a good analog/digital conversion with almost no loss of amplitude information due to the attenuation of the analog input signal.

In a further embodiment of the invention, the analog output of the sound card is connected to the input of the analog intermediate signal generating unit. Thus, the sound card, which is in this case a full-duplex sound card, is also used as a signal generator for generating the analog high-frequency signal. Sometimes, the analog output of the sound card is connected to the ground potential and the analog input, also referred to as line-in jack, of the sound card is connected to the ground potential as well. This may disturb subsequent capturing of the analog intermediate signal using the line-in jack of the sound card. To solve this problem, in a further preferred embodiment of the invention an isolation unit, e.g. an isolating transformer, is provided, the input of which is connected to the analog output of the sound card. With the isolation unit, the ground potential of the analog input of the sound card and the ground potential of the analog output of the sound card are isolated from each other. Thus, a problem no longer arises with subsequent capturing of the analog intermediate signal using the line-in jack of the sound card.

The analog/digital converter device according to the invention may also be provided in a video card device or a general multimedia card device, or just as a stand-alone device.

According to a further embodiment of the invention, a plurality of analog low-frequency signals, each having an important frequency component below the predetermined border frequency value and a plurality of analog high-frequency signals, each having a frequency above the predetermined border frequency value, are provided. The analog intermediate signal is in this embodiment generated using the analog low-frequency signals and the respective analog high-frequency signals, wherein the analog intermediate signal has characteristic analog features which make it possible to determine each analog low-frequency signal out of the plurality of the analog low-frequency signals from the analog intermediate signal. The digital intermediate signal has characteristic digital features which make it possible to determine a plurality of digital low-frequency signals from the digital intermediate signal, wherein the plurality of digital low-frequency signals corresponds to said plurality of analog low-frequency signals.

For generating the plurality of analog high-frequency signals, there may be provided one signal generator for generating all of said plurality of analog high-frequency signals, or a plurality of signal generators each of which generates one of said plurality of analog high-frequency signals. Furthermore, the number of signal generators may be more than one but less than the number of analog high-frequency signals to be generated, wherein each signal generator generates some of the plurality of analog high-frequency signals.

In the case of one signal generator being provided, an output of the signal generator is connected to a frequency splitting unit, for example to a plurality of band-pass filters to generate the respective plurality of high-frequency signals.

According to the invention such a single signal generator is preferably embodied by the analog/digital converter used for capturing and converting the analog intermediate signal, and further preferably by the analog/digital converter of the sound card if the analog/digital converter device according to the invention is used as a sound card device. The analog high-frequency signal provided at an analog output of the analog/digital converter, in particular at an analog output of the sound card, is splitted into a plurality of analog high-frequency signals by said frequency splitting unit, each of the plurality of analog high-frequency signals having a frequency above the predetermined border frequency value. Each provided analog high-frequency signal has preferably a unique frequency range.

Furthermore, the respective outputs of the frequency splitting unit, (e.g. the outputs of the said plurality of band-pass filters) may optionally be connected to a plurality of isolation units for the above discussed purposes.

In the case of providing a plurality of signal generators each signal generator may generate an analog high-frequency signal having a frequency above the predetermined border frequency value, wherein the signal generators are connected to an input of the analog intermediate signal generating unit. Each signal generator may comprise an isolation unit to securely divide their outputs from a common potential.

The analog/digital converter device is preferably provided in or for a computer system. It should be noted, that the computer system may be a personal computer, a Macintosh™ computer, a notebook, as well as a palmpilot, etc.

BRIEF DESCRIPTION OF THE DRAWING

FIG. 4 is a block diagram showing the concept of the digital low-frequency signal determination unit according to a preferred embodiment of the invention;

FIG. 5 is a block diagram showing a computer system including several components coupled to a computer bus according to a first preferred embodiment of the invention;

FIG. 6 is a block diagram showing a computer system including several components coupled to a computer bus according to a second preferred embodiment of the invention;

DESCRIPTION OF THE PREFERRED EMBODIMENT OF THE INVENTION

Figure 1:
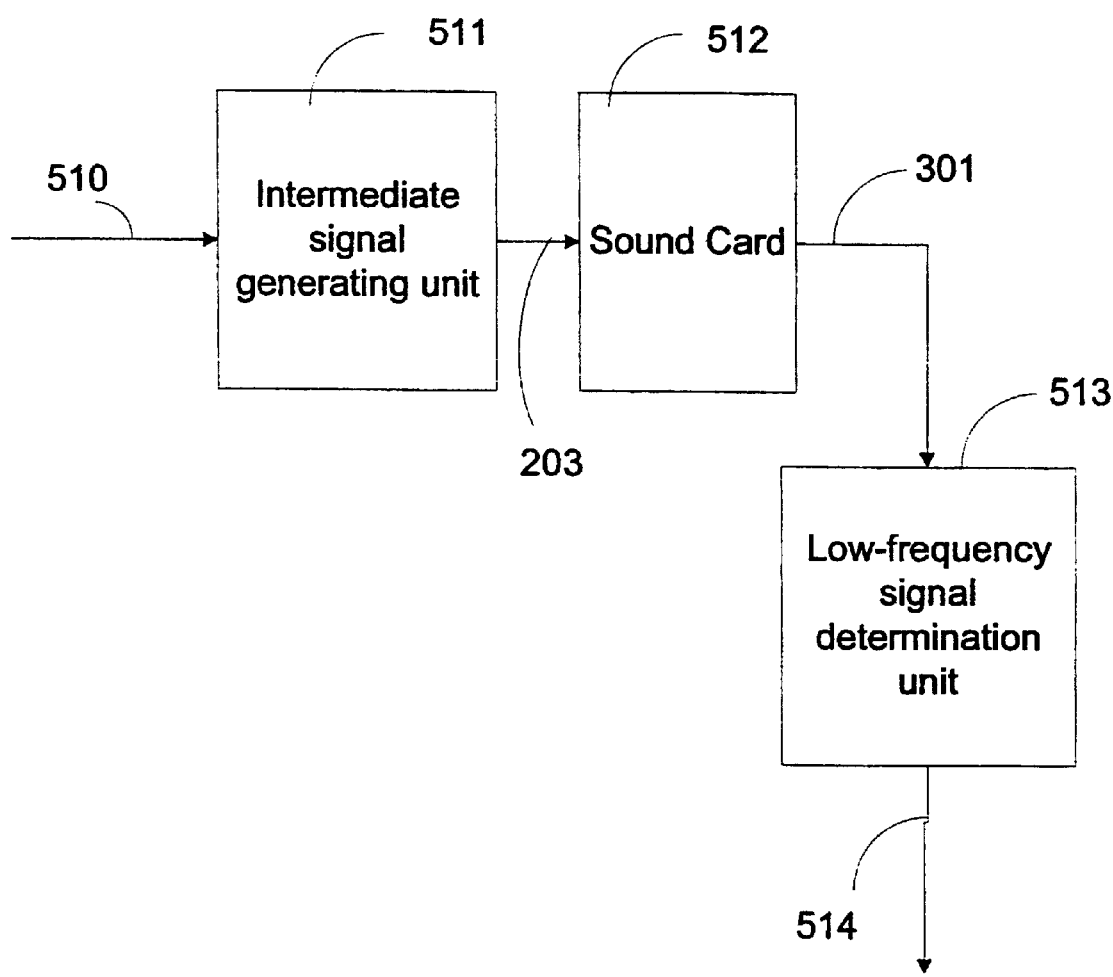
FIG. 1 is a block diagram showing the basic concept of the analog/digital converting according to the preferred embodiment of the invention.

Preferred embodiments of this invention and modifications thereof will now be described in detail with reference to the accompanying drawings.

1. First Preferred Embodiment of the Invention

In FIG. 5, a computer system 500 is shown.

The computer system 500 comprises a central processing unit (CPU) 501, a random access memory (RAM) 502, a bus arbiter 503, a video card 504, a hard disk drive 505, a CD-ROM drive 506, and a sound card device 507, all of these components being connected to a computer bus 508.

The sound card device 507 comprises an input 509 for inputting an analog signal via a microphone (not shown) or via a sensor (not shown).

In this embodiment it is further assumed that an analog signal 510 is input into the sound card device 507 via the input 509, wherein the analog signal 510 comprises signal components with at least one important frequency below a predetermined border frequency value, and is, therefore, an analog low-frequency signal. In this embodiment, the predetermined border frequency value is 20 Hz, as a further described common sound card 512 cannot process, i.e. capture and convert signals with frequency components below 20 Hz.

Via the input 509 of the sound card device 507, the analog low-frequency signal 510 is input to an analog intermediate signal generating unit 511.

Figure 2:
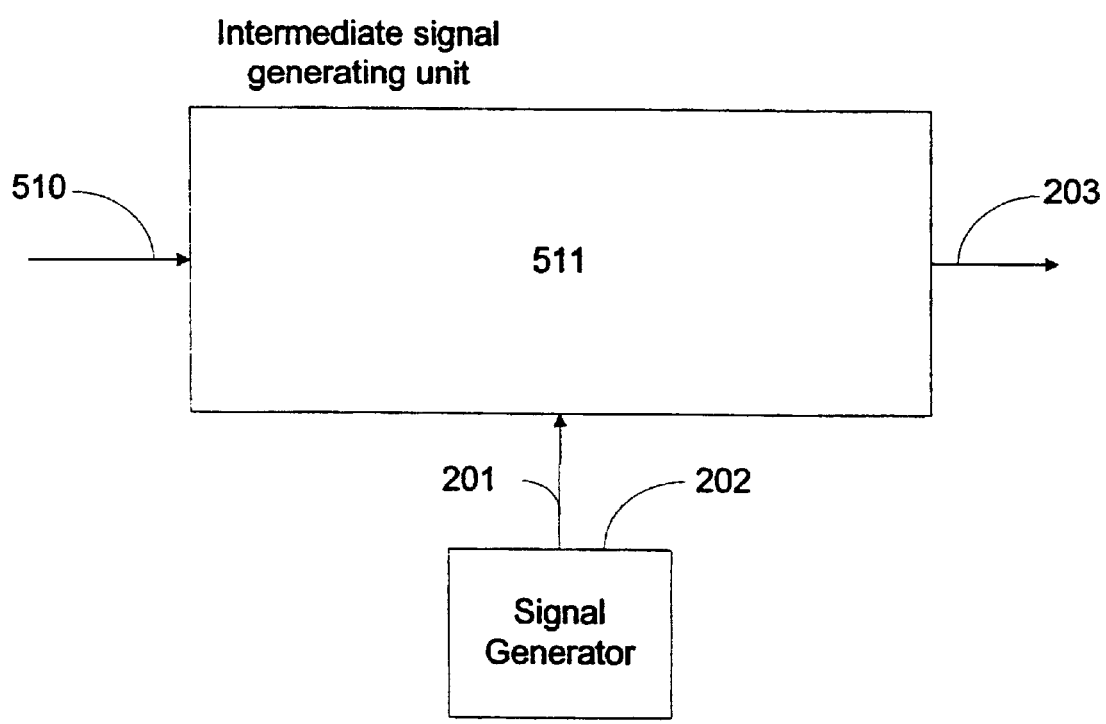
FIG. 2 is a block diagram showing the concept of the intermediate signal generating unit according to a preferred embodiment of the invention.

As shown in FIG. 2, the analog low-frequency signal 510 is input to the analog intermediate signal generating unit 511, where an analog intermediate signal 203 is generated using the analog low-frequency signal 510 and an analog high-frequency signal 201.

The analog high-frequency signal 201 is an analog signal with frequency components only above the predetermined border frequency value.

The analog high-frequency signal 201 is generated by a signal generator 202, which will be described later. The analog high-frequency signal 201 according to this first preferred embodiment of the invention is a sine wave signal with a frequency of 5,000 Hz.

According to this embodiment of the invention, in the analog intermediate signal generating unit 511, an amplitude modulation of the analog low-frequency signal 510 and the analog high-frequency sine wave signal 201 as a carrier signal is carried out. In case of an analog high-frequency signal in the form of a sine wave said amplitude modulation can be carried out by adding the analog low-frequency signal and the analog high-frequency sine wave signal and inputting the resulting signal to a diode as a non-linear device. At the output of the diode the analog intermediate signal 203 is thus provided.

It should be noted that, as explained above, instead of using an amplitude modulation, any other modulation technique or any linear or non-linear transformation may be applied to generate the analog intermediate signal 203, e.g.

frequency modulation, phase modulation, pulse modulation, change of the amplitude, frequency, phase or pulse of the analog low-frequency signal, respectively, or any combination of the techniques described above.

The output of the analog intermediate signal generating unit 511 is connected to an input of a common sound card 512, in this embodiment a Sound Blaster™, of the sound card device 507. The sound card 512 practically cuts off analog signals in a frequency range from 0 Hz to 20 Hz. The operating range of the sound card 512 is between 20 Hz and 20,000 Hz. In this embodiment, the sampling rate of the sound card 512 is 22,050 Hz and the number of bits per sample is 16.

It should be noted that, due to the linear or non-linear transformation used, it is possible to determine, i.e. to reconstruct the analog low-frequency signal 510 from the analog intermediate signal 203 using the modulation information or in general the information about the linear or non-linear transformation as a characteristic analog feature.

Figure 3:
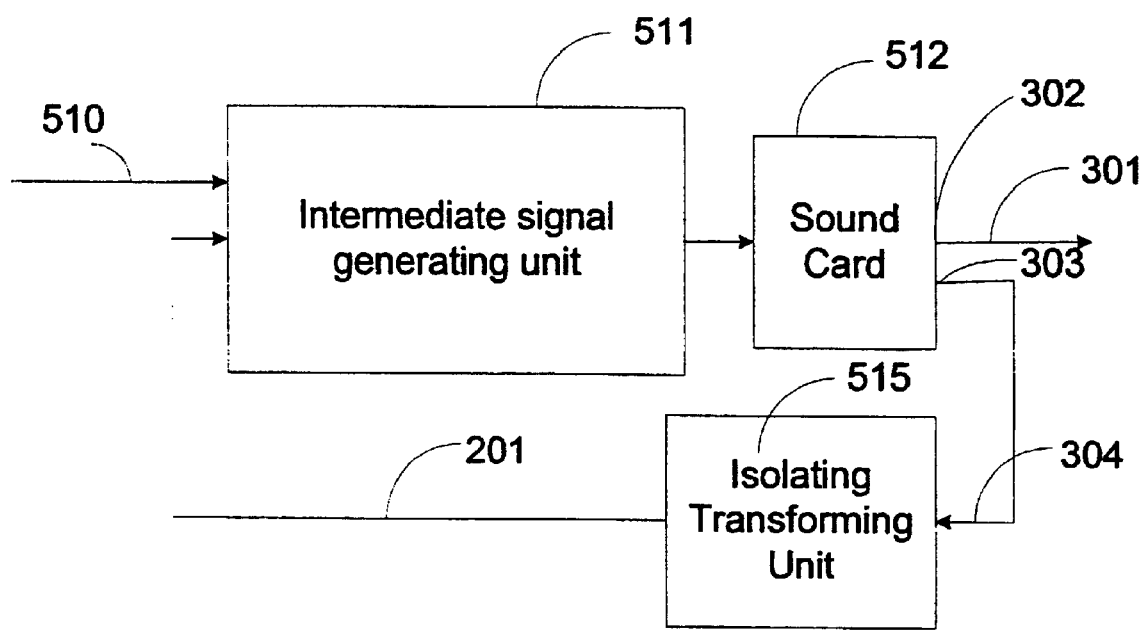
FIG. 3 is a block diagram showing the signal generator unit according to a preferred embodiment of the invention.

In the sound card 512, which is, generally speaking, an analog/digital converter, the applied analog intermediate signal 203 is digitized, thereby generating a digital intermediate signal 301 (cf. FIG. 3) which is provided at a digital output 302 of the sound card 512. Furthermore, the sound card 512 comprises an analog output 303, also referred to as a line/speaker-out jack. At this analog output 303 a 5,000 Hz sine wave signal 304 is provided.

Through the digitization by means of the sound card 512, no information pertaining to the amplitude modulation is lost. This information makes it possible to reconstruct the analog low-freqency signal. Thus, it is also possible after digitization to apply a demodulation to the digital intermediate signal 301 in order to reconstruct a (now digitized) low-frequency signal. Thus it should be noted that, in general, the modulation information or the information about the linear or non-linear transformation used as a characteristic analog feature becomes after digitization a characteristic digital feature with which it is possible to reconstruct a digital low-frequency signal.

It should be noted, that the analog high-frequency signal 304 provided at the analog output 303 of the sound card 512 may have any signal form, which can be generated by the sound card 512, and does not necessarily have to be a sine wave signal.

The sine wave signal 304 is input to an isolation unit 515 for the purpose of isolating the ground potential of the line/speaker-out jack 303 and the line-in jack of the sound card 512. From this it should be understood that, according to this embodiment of the invention, the sound card 512 also operates as the signal generator 203 for generating the analog high-frequency signal used by the intermediate signal generating unit 511. However, any other kind of signal generator 203, which generates an analog signal with frequency components which are all within the frequency range of the sound card 512 and above the predetermined border frequency value may be used in accordance with the invention.

An output of the isolation unit 515 is connected to a further input of the intermediate signal generating unit 511, thus applying the analog high-frequency signal 201 thereto.

The digital intermediate signal 301 is input to a low-frequency signal determination unit 513 (see FIGS. 1 and 5), in which a digital low-frequency signal 514 is generated.

The low-frequency signal determination unit 513 will now be described in detail with reference to FIG. 4.

It is to be noted that the digital intermediate signal 301 is a converted (digital) signal.

The digital low-frequency signal determination unit 513 comprises a band-pass filter 401, which significantly attenuates frequencies outside the frequency range of 4,000 Hz to 6,000 Hz according to the present embodiment, an envelop extractor unit 402, which will be described later in detail, a low-pass filter 403, which significantly attenuates frequency components above 150 Hz, a parameter computation unit 404, which will be described later in detail, and a shift-and-scale unit 405, which will be described later in detail.

As can be seen from FIG. 4, the digital intermediate signal 301 is input to the band-pass filter 401.

The filtered digital intermediate signal 406 which is mainly in the frequency range between 4,000 Hz to 6,000 Hz is input to the envelope extractor unit 402.

In the envelope extractor unit 402 the filtered digital intermediate signal 406 is processed in the following way.

Given the filtered digital intermediate signal 406 $x(1), \ldots, x(N)$, the output of the envelope extractor unit 402 is a digital extractor signal 407 given by:

$$y(n) = \begin{cases} 0 & \text{if } n = 1 \text{ or } n = N \\ x(n) & \text{if } 1 < n < N \text{ and } x(n) > x(n-1) \text{ and } x(n) > x(n+1) \\ y(n-1) & \text{otherwise} \end{cases}$$

The digital extractor signal 407 is input to the low-pass filter 403.

A digital low-pass filtered signal $z(n)$ 408 as the generated signal by the low-pass filter 403 can be written as:

$$z(n) = A \cdot s(n) + B$$

where A and B are constants, and s(n) is practically the same as the digital version of the desired analog low-frequency signal 510. Using the fact that z(n)=B when the analog low-frequency signal 510 is zero, the constant B is estimated by $B_1$ (by the parameter computation unit 404) according to the following formula:

$$B_1 = \frac{1}{M}\sum_{n=1}^{M} z(n)$$

where .M (M E<< N) is such that the signal segment {z(1), . . . , z(M)) }does not contain any input from the analog low-frequency signal 510. The estimated constant $B_1$ 409 is provided to the shift-and-scale unit 405.

In the shift-and-scale unit 405, a digital low-frequency signal $s_1(n)$ 514 is generated according to the following formula:

$$s_1(n) = \frac{(z(n) - B_1)}{A_1}$$

where $A_1$ is an arbitrarily chosen constant for scaling purposes.

In this embodiment, a value for the constant $A_1$ =0.001 is chosen. One may obtain a good estimation for the constant A instead of arbitrarily choosing a value A1 by using a known input analog low-frequency signal 510.

By adjusting the arbitrarily chosen constant $A_1$ until the magnitude of $s_1(n)$ becomes practically the same as that of the known input analog low-frequency signal 510, the value of $A_1$ becomes a good estimation of the constant A.

The basic general principal of the invention will further be described with reference to FIG. 1.

The analog low-frequency signal 510 is input to the intermediate signal generating unit 511, which generates the analog intermediate signal 203. The sound card 512 uses the analog intermediate signal 203, which comprises frequency components which can be captured by the sound card 512 and digitizes the analog intermediate signal 203, thereby generating the digital intermediate signal 301, which includes the digital low-frequency signal 514 and the digital high-frequency signal.

The digital intermediate signal 301 is input to the low-frequency signal determination unit 513, which generates the desired digital low-frequency signal 514 which constitutes a digital reconstruction of the analog low-frequency signal 510.

2. Second Preferred Embodiment of the Invention

Similar components in the first and in a second embodiments are denoted with similar reference numbers.

As can be seen from FIG. 6, according to a second preferred embodiment of the invention, there is provided a plurality of n analog low-frequency signals 601, 602, 603, 604.

The n analog low-frequency signals 601, 602, 603, 604 are input to a corresponding number of n analog intermediate signal generating units 605, 606, 607, 608, respectively. The n analog intermediate signal generating-units 605, 606, 607, 608 are similar to the analog intermediate signal generating unit according to the first embodiment of the invention.

Furthermore, each of the n analog intermediate signal generating units 605, 606, 607, 608 receives an analog high-frequency signal out of a corresponding plurality of n analog high-frequency signals 609, 610, 611, 612.

Similar to the analog low-frequency signal in the first embodiment, each analog low-frequency signal 601, 602, 603, 604 has at least one important frequency component below the predetermined border frequency value of the sound card 512.

Each of the analog high-frequency signals 609, 610, 611, 612 has a frequency above the predetermined border frequency value of the sound card 512, wherein each analog high-frequency signal has a frequency in a unique frequency range.

In other words, the first analog high-frequency signal 609 has e.g. a frequency in a range between 2 kHZ and 4 kHZ, the second analog high-frequency signal 610 has a frequency in a range between 4 kHZ and 6 kHZ, the third analog high-frequency signal 611 has a frequency in a range between 6 kHZ and 8 kHZ, . . . , and the n-th analog high-frequency signal 612 has a frequency in a range between 2n kHZ and (2n+2)kHZ, wherein all of these frequency ranges are within the frequency range of the sound card 512.

Therefore, the total number n of the analog high-frequency signals and, accordingly, the total number n of the analog low-frequency signals to be processed according to the invention is limited by the total input bandwidth of the sound card, since the summed-up total bandwidth of the analog intermediate signals produced from the analog low-frequency signals and the analog hight-frequency signals must be lower than the total input bandwidth of the sound card.

The analog high-frequency signals 609, 610, 611, 612 may be generated in different ways.

According to a first alternative, which is shown in FIG. 6, the sound card 512 provides at an analog output 303 thereof one analog high-frequency output signal 304 which is input into a multiple signals generator unit 613. The multiple signals generator unit 613 comprises a signal splitting unit 614 with n band-pass filters 615 which have filtering ranges according to the frequency ranges desired for the n analog high-frequency signals 609, 610, 611, 612. The n band-pass filters 615 are connected to n isolation units 515, respectively, which are similar to that of the first embodiment. The n isolation units 515 are only needed, if the analog input and the analog output of the respective analog/digital converter, i.e. according to this embodiment the sound card 512, share a common ground potential. At the outputs of the n isolation units 515, the n analog high-frequency signals 609, 610, 611, 612 are provided.

The sound card 512 is controlled, via a further input 617, by a control signal 616, which is provided by the CPU 501, so that the needed analog high-frequency output signal 304 is provided by the sound card 512. The analog high-frequency output signal 304 is preferably a mixed analog signal comprising signal components with the needed frequencies for generating the n high-frequency signals 609, 610, 611, 612.

According to a second alternative, the n analog high-frequency signals 609, 610, 611, 612 may be provided by one or more separate signal generator(s) (not shown), each of them may e.g. provide one high-frequency signal.

In case of one signal generator, the generated mixed analog high-frequency signal is input into the above described signal splitting unit 614 with n band-pass filters 615, thereby producing the n analog high-frequency signals 609, 610, 611 and 612. In case of n signal generators, each generator provides one of the desired n analog high-frequency signals 609, 610, 611, 612 directly.

According to a third alternative, the analog/digital converter, e.g. the sound card 512, may provide a plurality of analog outputs, thereby providing a plurality of analog high-frequency output signals, which may directly be used to generate the n high-frequency signals 609, 610, 611, 612.

Furthermore, each analog high-frequency signal, be it generated by one or more separate signal generator or by the analog/digital converter (e.g. the sound card 512), is optionally input into a separate isolation unit for the above mentioned purposes before applying them to the corresponding n analog intermediate signal generating units 605, 606, 607 and 608.

Furthermore, the alternatives described above may arbitrarily be combined with each other, thereby generating the n analog high-frequency signals 609, 610, 611, 612.

In the same manner as the analog intermediate signal generating unit 511 according to the first embodiment, the n analog intermediate signal generating units 605, 606, 607, 608 generate analog intermediate signals 618, 619, 620, 621, respectively.

The n analog intermediate signals 618, 619, 620, 621 are input to a signal mixing unit 622, where the n analog intermediate signals 618, 619, 620, 621 are mixed, e.g. by simply summing the input n analog intermediate signals 618, 619, 620, 621, thereby generating an analog mix signal 623.

The analog mix signal 623 is input to a signal conditioning unit 624. In the signal conditioning unit 624, the analog mix signal 623 is processed in such a way, that the generated analog conditioned signal satisfies a predetermined specification of the sound card 512 (e.g. requirements on input voltage, current and impedance).

The signal conditioning unit 624 is, however, optional. It is not necessary, if e.g. the above requirements can be satisfied by choosing suitable analog high-frequency signals and suitable components in the n analog intermediate signal generating units 605, 606, 607, 608, thereby making sure, that the generated analog mix signal 623 satisfies the predetermined specification of the sound card 512.

The generated analog conditioned signal is input into the sound card 512 via its analog input.

In this context, it should be noted, that e.g. in case that the analog/digital converter is used in a video card, the conditioning should be done in an explicit way by the signal conditioning unit 624 such that the n analog intermediate signals 618, 619, 620, 621 will be processed in such a way that the resulting analog conditioned signal satisfies the specification of the respective video encoding standard.

Furthermore, it should be understood, that a signal conditioning unit 624 may also be provided in the sound card device according to the first embodiment of the present invention.

According to the second embodiment, the low-frequency signal determination unit comprises n low-frequency signal determination units as described in respect to the first embodiment. The n low-frequency signal determination units are formed such that they determine the n corresponding digital low-frequency signals 625, 626, 627, 628, which are desired. The n digital low-frequency signals 625, 626, 627, 628 are applied to the computer bus 508.

3. Third preferred embodiment of the invention

According to a third embodiment of the invention (not shown), the sound card may provide a plurality of k analog inputs. In this case, the n analog intermediate signals generated by the n analog intermediate signal generating units may be processed into a plurality of k analog mix signals, or, if a signal conditioning unit is used, into a plurality of k analog conditioned signals, which are input into the k analog inputs of the sound card. If the number k of analog inputs of the sound card 512 is equal to the number n of the analog intermediate signal generating units, each analog input of the sound card may be connected directly, i.e. without an interconnected signal mixing unit, to the output of one analog intermediate signal generating unit respectively. Thus, one analog intermediate signal is input into one analog input of the sound card 512, respectively.

Furthermore, it is to be mentioned that also in this third preferred embodiment of the invention the n analog intermediate signals may optionally be connected to a plurality of isolation units for the above discussed purposes.

Furthermore, k signal conditioning units may be provided between the respective analog intermediate signal generating units and the analog inputs of the sound card.

What is claimed is:

1. A method for analog/digital converting of at least one analog low-frequency signal with an analog/digital converter which can capture only an analog signal with a frequency above a predetermined border frequency value, wherein at least one analog low-frequency signal, which has at least one frequency component below the predetermined border frequency value is provided, said at least one frequency component being such that the analog low-frequency signal, when converted by said analog/digital converter without said frequency component, cannot be reconstructed from a corresponding output signal of the analog/digital converter, at least one analog high-frequency signal, which has a frequency above the predetermined border frequency value, is provided, an analog intermediate signal is generated using the analog low-frequency signal and the analog high-frequency signal, the analog intermediate signal having a characteristic analog feature which makes it possible to determine the analog low-frequency signal from the analog intermediate signal, the analog intermediate signal is input into the analog/digital converter, the analog intermediate signal is converted into a digital signal thereby generating a digital intermediate signal, the digital intermediate signal having a characteristic digital feature which makes it possible to determine a digital low-frequency signal from the digital intermediate signal, and the digital low-frequency signal is determined from the digital intermediate signal using the characteristic digital feature.

2. A method for analog/digital converting of at least one analog low-frequency signal according to claim 1, wherein the step of generating the analog intermediate signal comprises a linear or non-linear operation being processed on the analog low-frequency signal and the analog high-frequency signal.

3. A method for analog/digital converting of at least one analog low-frequency signal according to claim 2, wherein the linear or non-linear operation comprises one of the following steps:

adding the analog low-frequency signal to the analog high-frequency signal, subtracting the analog low-frequency signal from the analog high-frequency signal, multiplying the analog low-frequency signal with the analog high-frequency signal, convolving the analog low-frequency signal with the analog high-frequency signal.

4. A method for analog/digital converting of at least one analog low-frequency signal according to claim 1, wherein the characteristic digital feature is at least one of the following features:

the amplitude of the digital intermediate signal, the frequency of the digital intermediate signal, the phase of the digital intermediate signal, the pulse of the digital intermediate signal, a change of the amplitude of the digital intermediate signal, a change of the frequency of the digital intermediate signal, a change of the phase of the digital intermediate signal.

a change of the pulse of the digital intermediate signal.

5. A method for analog/digital converting of at least one analog low-frequency signal according to claim 1, wherein the analog high-frequency signal is a sine wave signal.

6. A method for analog/digital converting of at least one analog low-frequency signal according to claim 5, wherein the analog high-frequency signal has a frequency of about 5000 Hz.

7. A method for analog/digital converting of at least one analog low-frequency signal according to claim 1, wherein the analog/digital converter is used in conjunction with a sound card.

8. A method for analog/digital converting of at least one analog low-frequency signal according to claim 7, wherein at least one analog output signal of the sound card is used as the at least one analog high-frequency signal.

9. A method for analog/digital converting of at least one analog low-frequency signal according to claim 7, wherein an analog output signal of the sound card is transformed into an isolated output signal of the sound card in order to isolate the ground potential of the output of the sound card, and the isolated output signal of the sound card is used as the high-frequency signal.

10. A method for analog/digital converting of an analog low-frequency signal according to claim 1, wherein a plurality of analog low-frequency signals is provided, a plurality of analog high-frequency signals is provided, the analog intermediate signal is generated using the analog low-frequency signals and the analog high-frequency signals, wherein the analog intermediate signal has characteristic analog features which make it possible to determine each analog low-frequency signal out of the plurality of the analog low-frequency signals from the analog intermediate signal, the digital intermediate signal has characteristic digital features which make it possible to determine a plurality of digital low-frequency signals from the digital intermediate signal, and the digital low-frequency signals out of the plurality of the digital low-frequency signals are determined from the digital intermediate signal using the characteristic digital features.

11. A method for analog/digital converting of an analog low-frequency signal according to claim 10, wherein each analog high-frequency signal has a unique frequency range.

12. A method for analog/digital converting of an analog low-frequency signal according to claim 11, wherein the analog/digital converter is used in conjunction with a sound card, and an analog output signal of the sound card is splitted into a plurality of output signals, each output signal having a respective unique frequency range, said plurality of output signals being used as the analog high-frequency signals.

13. A method for analog/digital converting of an analog low-frequency signal according to claim 12, wherein the sound card is controlled by a processor of a computer in order to generate the analog output signal of the sound card.

14. An analog/digital converter device for analog/digital converting of at least one analog low-frequency signal, comprising an analog intermediate signal generating unit for generating an analog intermediate signal using the analog low-frequency signal, which has at least one frequency component below a predetermined border frequency value, and at least one analog high-frequency signal, which has a frequency above the predetermined border frequency value, wherein the generated analog intermediate signal has a characteristic analog feature which makes it possible to determine the analog low-frequency signal from the analog intermediate signal, an analog/digital converter for converting an analog signal into a digital signal, which is connected to an output of the analog intermediate signal generating unit so that the analog intermediate signal is input into the analog/digital converter so that a digital intermediate signal is generated, wherein the analog/digital converter is able to capture only an analog signal with a frequency above the predetermined border frequency value, and the digital intermediate signal has a characteristic digital feature which makes it possible to determine a digital low-frequency signal from the digital intermediate signal, a low-frequency determination unit for determining the digital low-frequency signal from the digital intermediate signal using the characteristic digital feature, the low-frequency determination unit being connected to an output of the analog/digital converter.

15. An analog/digital converter device according to claim 14, wherein the analog intermediate signal generating unit comprises means for processing a linear or non-linear operation on the analog low-frequency signal and the analog high-frequency signal.

16. An analog/digital converter device according to claim 15, wherein the analog intermediate signal generating unit comprises means for processing one of the following operations:

adding the analog low-frequency signal to the analog high-frequency signal, subtracting the analog low-frequency signal from the analog high-frequency signal, multiplying the analog low-frequency signal with the analog high-frequency signal, convolving the analog low-frequency signal with the analog high-frequency signal.

17. An analog/digital converter device according to claim 14, wherein the analog/digital converter is formed such that the characteristic digital feature of the generated digital intermediate signal is at least one of the following features:

the amplitude of the digital intermediate signal, the frequency of the digital intermediate signal, the phase of the digital intermediate signal, a change of the amplitude of the digital intermediate signal, a change of the frequency of the digital intermediate signal, a change of the phase of the digital intermediate signal.

18. An analog/digital converter device according to claim 14, further comprising at least one signal generator for generating said analog high-frequency signal.

19. An analog/digital converter device according to claim 18, wherein the signal generator generates a sine wave signal with a frequency of about 5000 Hz.

20. An analog/digital converter device according to claim 14, wherein the analog intermediate signal generating unit for generating an analog intermediate signal uses a plurality of analog low-frequency signals, and a plurality of analog high-frequency signal, wherein the generated analog intermediate signal has characteristic analog features which make it possible to determine the analog low-frequency signals from the analog intermediate signal, the analog/digital converter is formed in such a manner that the generated digital intermediate signal has characteristic digital features which make it possible to determine digital low-frequency signals from the digital intermediate signal, the analog/digital converter device further comprises a plurality of signal generators for generating said plurality of analog high-frequency signals, the signal generators being connected to an input of the analog intermediate signal generating unit.

21. An analog/digital converter device according to claim 14, wherein the analog intermediate signal generating unit for generating an analog intermediate signal uses a plurality of analog low-frequency signals, and a plurality of analog high-frequency signal, wherein the generated analog intermediate signal has characteristic analog features which make it possible to determine the analog low-frequency signals from the analog intermediate signal, the analog/digital converter is formed in such a manner that the generated digital intermediate signal has characteristic digital features which make it possible to determine digital low-frequency signals from the digital intermediate signal, the analog/digital converter device further comprises a signal generator for generating a high-frequency signal, and a frequency splitting unit for splitting the high-frequency signal into said plurality of high-frequency signals, thereby generating said plurality of analog high-frequency signals.

22. A sound card device with an analog/digital converter device according to claim 14, wherein the analog/digital converter is a sound card.

23. A sound card device according to claim 22, wherein an analog output of the sound card, at which an analog output signal is provided, is connected to the input of the intermediate signal generating unit, the analog output signal is used as said analog high-frequency signal.

24. A sound card device according to claim 22, wherein an analog output of the sound card, at which an analog output signal is provided, is connected to the input of an isolation unit for generating an isolated output signal in order to isolate the ground potential of the output of the sound card, and the output of the isolation unit is connected to the input of the intermediate signal generating unit, the isolated analog output signal is used as the analog high-frequency signal.

25. A sound card device according to claim 22, wherein an analog output of the sound card, at which an analog output signal is provided, is connected to an input of a frequency splitting unit for splitting the analog output signal into a plurality of analog output signals used as said plurality of analog high-frequency signals.

26. A computer system including a sound card device according to claim 22.

27. A computer system including a sound card device according to claim 26, wherein a processor of the computer system is connected to the sound card in order to control the sound card in such a manner that the analog output signal of the sound card is provided.

28. An analog intermediate signal generating unit to be connected to an analog/digital converter which can capture and convert only an analog signal with a frequency above a predetermined border frequency value of said analog/digital converter, said analog intermediate signal generating unit being provided for processing an analog low-frequency signal which has at least one frequency component below the predetermined border frequency value, said low frequency component being such that the analog low-frequency signal, when captured and-converted by said analog/digital converter without said frequency component, cannot be reconstructed from an output signal of the analog/digital converter, said analog intermediate signal generating unit comprising an input for said analog low-frequency signal, an input for an analog high-frequency signal which has a frequency above the predetermined border frequency value, a processing unit for carrying out a linear or non linear operation on the analog low-frequency signal and the analog high-frequency signal, and an output for providing an analog intermediate signal which is produced by said operation and which has sufficient frequency components above the predetermined border frequency value so that it is possible to reconstruct the analog low-frequency signal from a digital output signal of the analog/digital converter resulted from the capturing and converting said analog intermediate signal by said analog/digital converter.

29. A sound card device with an analog intermediate signal generating unit according to claim 28, wherein the analog/digital converter is a sound card.

30. A sound card device according to claim 29, wherein an analog output of the sound card, at which an analog output signal is provided, is connected to the input of the intermediate signal generating unit, the analog output signal is used as said analog high-frequency signal.

31. A sound card device according to claim 29, wherein an analog output of the sound card, at which-an analog output signal is provided, is connected to the input of an isolation unit for generating an isolated output signal in order to isolate the ground potential of the output of the sound card, and the output of the isolation unit is connected to the input of the intermediate signal generating unit, the isolated analog output signal being used as said analog high-frequency signal.

32. A computer system including a sound card device according to claim 29.

* * * * *